United States Patent [19]

Christophorou et al.

[11] Patent Number: 4,970,434

[45] Date of Patent: Nov. 13, 1990

[54] DIELECTRIC LIQUID PULSED-POWER SWITCH

[75] Inventors: Loucas G. Christophorou, Oak Ridge; Homer Faidas, Knoxville, both of Tenn.

[73] Assignee: The United States of America as represented by the United States Department of Energy, Washington, D.C.

[21] Appl. No.: 400,626

[22] Filed: Aug. 30, 1989

[51] Int. Cl.⁵ .............................. H01J 40/06
[52] U.S. Cl. .................. 315/111.01; 315/150; 250/211 R; 313/542
[58] Field of Search ............... 315/111.01, 150, 159, 315/290; 250/211 R; 313/523, 538, 541, 542, 543, 544

[56] References Cited

U.S. PATENT DOCUMENTS

| 4,577,114 | 3/1986 | Levy et al. ................ 250/211 R X |
| 4,743,807 | 10/1988 | Christophorou et al. .......... 315/150 |
| 4,751,428 | 6/1988 | Christophorou et al. .......... 313/637 |
| 4,771,168 | 9/1988 | Gundersen et al. ............ 313/538 X |
| 4,792,724 | 12/1988 | Christophorou et al. .......... 313/637 |

OTHER PUBLICATIONS

Schmitt et al., "Electron-Beam Controlled Semiconductor Opening/Closing Switch," Department of Electrical and Computer Engineering, Old Dominion University, Norfolk, VA, pp. 271-274.

Primary Examiner—David Mis
Attorney, Agent, or Firm—Katherine P. Lovingood; Stephen D. Hamel; William R. Moser

[57] ABSTRACT

This disclosure identifies dielectric liquids for use as opening and closing switching media in pulsed power technology, and describes a dielectric-liquid-pulsed-power switch empolying flashlamps.

9 Claims, 2 Drawing Sheets

DIELECTRIC LIQUID PULSED-POWER SWITCH

This invention relates to an opening and closing switch and particularly to a pulsed-power switch having a dielectric liquid as the conducting and insulating medium and was developed pursuant to a contract with the U.S. Department of Energy.

BACKGROUND OF THE INVENTION

Recently there has been an increasing interest in the possibility of employing inductive energy storage in pulsed-power applications because of high intrinsic capacity of such storage and also the fact that this energy can be transferred to the load in nanosecond time scales. The key to utilizing this technology is the availability of repetitive fast opening and closing switches.

A number of new concepts and materials have been proposed for various types of opening and closing pulsed-power switches. Two salient features of these proposals are, first, the switching medium can be ionized and made conducting by a laser or an electron beam thereby closing the switch, and, second, the switching medium has a high resistance when the ionizing source is off thereby opening the switch. The optimization of the materials and the parameters of operation of these types of switches have been the subject of many recent studies which have concentrated on the use of gas mixtures as the conducting/insulating medium. Yet, there is a continuing need to develop a switching medium that can be made conducting with a conventional energy source and is easily manufactured and maintained.

SUMMARY OF THE INVENTION

In view of the above needs, it is an object of this invention to provide a switching medium that is both a good conductor as well as a good insulator.

It is another object of this invention to provide an opening and closing switch that is easily manufactured and maintained.

An additional object of this invention is to provide a dielectric liquid that can be used as a medium in opening and closing switches.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the apparatus of this invention may comprise a switch wherein the switching medium comprises a dielectric liquid that has a negative $V_0$. The electron conduction band possessed by such a medium means the electron drift velocities are relatively great when the switch is closed, thereby rendering the medium conducting. However, when open, liquid density and the absence of charged carriers in the liquid render the medium insulating.

DETAILED DESCRIPTION OF THE PREFERRED EMBODIMENT

Figure 1:
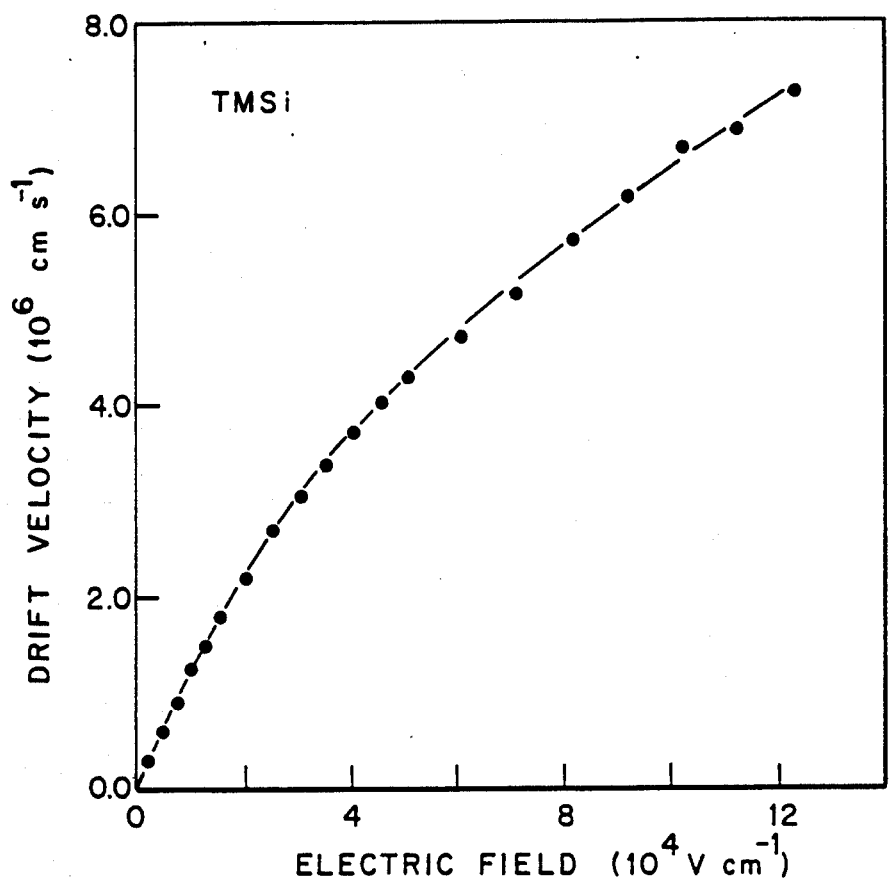
FIG. 1 shows measurements of drift velocities, w, relative to field, E, (w vs E) for TMSi.

It is known that the minimum energy of the excess electrons, $V_0$, of a number of room temperature dielectric liquids and their mixtures, is negative. For instance, the room temperature $V_0$ values of tetramethylsilane (TMSi), 2,2,4,4-tetramethylpentane (TMP), neopentane (TMC), tetramethyltin (TMSn) are $-0.62$, $-0.36$, $-0.43$, and $-0.75$ eV, respectively. These values have been determined by scientists studying the state of electrons in liquid media. Electrons in conduction bands of such liquids are quasifree and drift under an applied electric field with astonishingly high drift velocities. Therefore, such liquids are good conductors of excess electrons for reasonable values of E; they are, also, good insulators, easily withstanding fields in excess of $\sim 3 \times 10^5$ V cm$^{-1}$. In support of this concept, FIG. 1 shows recent measurements of drift velocities relative to field (w vs E) for TMSi.

Furthermore, because of their negative $V_0$, the work function at zero field of a metal immersed in them is lower than that in vacuum. When an external field is applied, the work function is lowered further. This lowers the minimum photon energy required to eject an electron from a metal surface into the liquid. For a fixed E, the photoelectron yield increases rapidly with increasing photon energy. It is, therefore, possible to employ conventional pulsed light sources to inject large numbers of excess electrons in dielectric liquids with negative $V_0$. A large fraction of the electrons injected at the metal/liquid interface returns to the cathode, so that the conduction current traversing the liquid is normally a fraction of that injected at the interface.

The dielectric liquids TMSi, TMP, TMC, TMSn, and their mixtures, as well as other liquids with similar electron transport, $V_0$, and breakdown strength properties, can be employed as the switching medium in an opening or closing switch. In the closing phase of the switch the liquid acts as a conductor of the electrons injected into it for E values of $\sim 10^4$ V cm$^{-1}$ or less, and in the opening phase of the switch the liquid acts as an insulator capable of withstanding fields 50 to 100 times larger.

Figure 2:
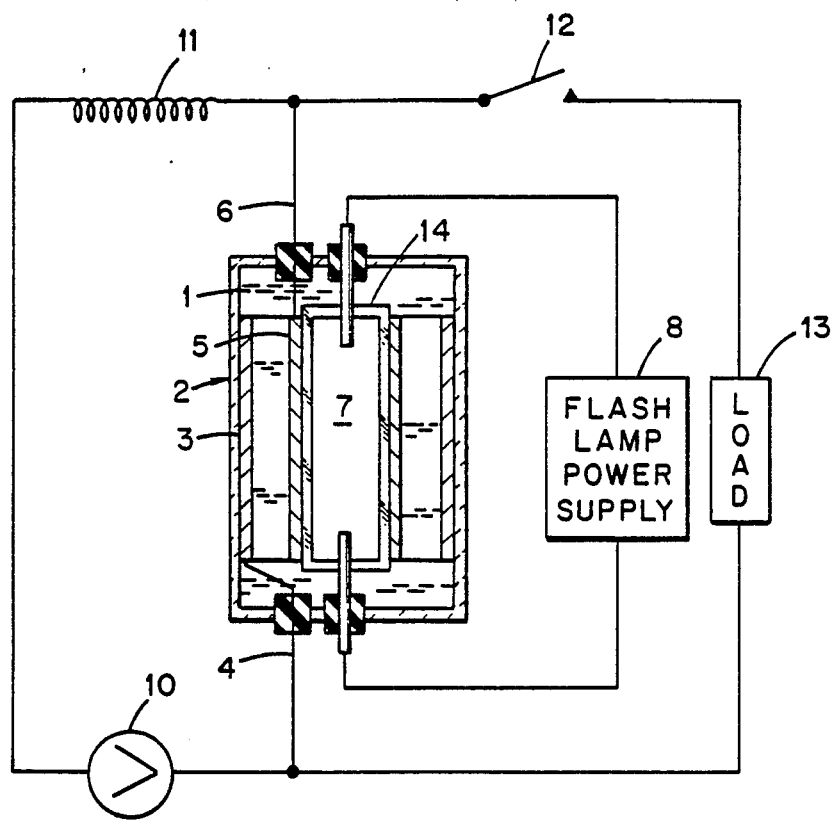
FIG. 2 is a schematic of an inductive storage switch.

In FIG. 2, a schematic of such a switch is depicted for the case of inductive storage. The main features of the dielectric liquid pulsed-power switch are: a dielectric liquid 1 as the switching medium contained in a cell 2 bounded on opposite sides by a cylindrical anode with mirror like surfaces 3, connected to an anode electrode 4, and a metallic or semiconducting surface of a suitable thickness to be semitransparent acting as the photoemissive material and as a cylindrical cathode 5, connected to the cathode electrode 6; as the ionization source, a light source 7 activated by a power supply 8. External to the cell 2 are conventional switching components of a current source 10, a storage inductor 11, a closing switch 12 and the load 13. The dielectric liquid can be one of the liquids mentioned above. The light source considered is a gas-filled flashlamp of appropriate geometry generating a uv light pulse of the desired intensity and duration as determined by its design, gas selection and pressure. Suitable film materials include Ba, Mg, Cs, Cu and Cs$_3$Sb. Suitable gases include Xe, Ar, Ne, H$_2$, D$_2$, N$_2$, and mixtures of these gases.

Such flashlamps have broad and attractive characteristics with regard to efficiency, pulse energy, pulse width, pulse rise and fall time, repetition rate, wavelength, and lamp life. While no single flashlamp can be optimized in all of these performance characteristics, the range over which these operating parameters vary should allow considerable flexibility in choosing a flashlamp for a given liquid switch application. The lamp's glass envelope 14 can be made of a uv transmitting material coated with metallic or semiconducting film and serve as the cathode and the electron injecting material. By proper optimization of the thickness and the composition of the coating material one can maximize the photoelectron yield, minimize light transmission, and achieve good electrical conductivity and stability. Such determinations can be made by persons skilled in the art of switching mechanisms. With the cathode arrangement in FIG. 2 the light transmitted into the liquid can be minimized and the reflected light can be "recycled" in the flashlamp. Also the light transmitted into the liquid would be reflected by the anode back onto the cathode; this would substantially increase the effective electron yield.

It should be noted that opening switches for inductive energy storage normally require closing times in the s to ms range and opening times <50 to 100 ns. Since the electron drift times, d/w where d is drift distance, are of the order of ns, the switch opening time will be determined by the fall time of the light pulse. While many flashlamps, such as Xe flashlamps, can generate kJ light pulses of $\mu s$ to ms duration, the fall times of these pulses—at least for their uv part—must be short, about 100 ns, for those applications requiring short and large amplitude load pulses.

The dielectric liquid pulsed-power switch has many advantages over gas switches. The liquid is not subjected to irradiation; it simply acts as a conductor of electricity or as an insulator and it has much higher dielectric strength than do gases or semiconductors of similar size. It may also serve as coolant for heat dissipation. Also, the ionization of a metallic coating causes no damage, fatigue or decomposition of the liquid switching material and can allow high current densities. Due to the small size, compactness, and low cost of this type of switch, many such switches can be connected in parallel for high current applications. The flashlamp is smaller, cheaper, and more efficient than a laser or a pulsed electron beam arrangement, and the special geometry in FIG. 2 "recycles" reflected photons so that the effective electron yield could be substantially higher than that of a simple single incidence geometry. For all these reasons, the use of a liquid conducting and insulating medium is a significant improvement over previous gas switches.

We claim:

1. A pulsed power switch comprising:
    a cell containing a dielectric liquid; a cathode; an anode; an electron source.

2. The switch of claim 1 wherein said dielectric liquid has a negative $V_0$.

3. The switch of claim 1 wherein said dielectric liquid is selected from the group comprising tetramethylsilane, 2,2,4,4-tetramethylpentane, neopentane, tetramethyltin and mixtures thereof.

4. The switch of claim 1 wherein said electron source comprises a flashlamp in conjunction with a material capable of emitting electrons when exposed to light emitted by said flashlamp.

5. The switch of claim 1 wherein said electron source comprises;
    a transparent containment vessel capable of transmitting light;
    said containment vessel having contained therein a gas capable of generating light;
    a means for activating said gas to generate light;
    the exterior surface of said containment vessel comprising material capable of ejecting electrons from its surface when exposed to light;
    said exterior surface being within said cell and contacting said dielectric liquid.

6. The switch of claim 5 wherein said gas is selected from the group comprising Xe, Ar, Ne, $H_2$, $D_2$, $N_2$, and mixtures thereof.

7. The switch of claim 5 wherein said material capable of ejecting electrons is selected from the group comprising metals and semiconductors.

8. The switch of claim 7 wherein said semiconductors are selected from the group consisting of Ba, Mg, Cs, Cu, and $Cs_3Sb$.

9. The switch of claim 5 wherein said transparent vessel comprising electron emitting material also serves as said cathode.

* * * * *